(12) United States Patent
Ishikawa et al.

(10) Patent No.: US 8,114,940 B2
(45) Date of Patent: Feb. 14, 2012

(54) RUBBER-MODIFIED POLYAMIDE RESIN, EPOXY RESIN COMPOSITION AND CURED PRODUCT THEREOF

(75) Inventors: Kazunori Ishikawa, Fukuyama (JP); Makoto Uchida, Kita-ku (JP); Shigeru Moteki, Kita-ku (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 939 days.

(21) Appl. No.: 12/083,529

(22) PCT Filed: Oct. 26, 2006

(86) PCT No.: PCT/JP2006/321337
§ 371 (c)(1),
(2), (4) Date: Apr. 14, 2008

(87) PCT Pub. No.: WO2007/052523
PCT Pub. Date: May 10, 2007

(65) Prior Publication Data
US 2009/0071697 A1 Mar. 19, 2009

(30) Foreign Application Priority Data
Oct. 31, 2005 (JP) ................. 2005-315803

(51) Int. Cl.
C08G 81/00 (2006.01)
(52) U.S. Cl. ....... 525/178; 525/183; 525/184; 525/92 B; 525/534; 528/192; 524/607
(58) Field of Classification Search ........... 525/17, 525/183, 184, 92 B, 534; 528/192; 524/607
See application file for complete search history.

(56) References Cited

U.S. PATENT DOCUMENTS

| 5,019,944 | A | 5/1991 | Ishii et al. |
| 5,112,694 | A | 5/1992 | Konotsune et al. |
| 5,274,071 | A | 12/1993 | Santa et al. |
| 5,342,895 | A | 8/1994 | Tagami et al. ........ 525/183 |
| 7,608,336 | B2 | 10/2009 | Akatsuka et al. |
| 2003/0166796 | A1 | 9/2003 | Imaizumi et al. ........ 525/534 |
| 2004/0024124 | A1 | 2/2004 | Imaizumi et al. |
| 2004/0147658 | A1 | 7/2004 | Matsushima et al. |
| 2005/0048306 | A1 | 3/2005 | Suzuki et al. |
| 2006/0003165 | A1 | 1/2006 | Akatsuka et al. |
| 2006/0058469 | A1 | 3/2006 | Akatsuka et al. |
| 2009/0056982 | A1 | 3/2009 | Akatsuka et al. |
| 2009/0071697 | A1 | 3/2009 | Ishikawa et al. |
| 2009/0081466 | A1 | 3/2009 | Ishikawa et al. |

FOREIGN PATENT DOCUMENTS

| EP | 1300444 A1 | 4/2003 |
| EP | 1333077 A1 | 8/2003 |
| EP | 1566395 A1 | 8/2005 |
| JP | 61-245868 A | 11/1986 |
| JP | 62-72745 | 4/1987 |
| JP | 3-47836 | 2/1991 |
| JP | 3-164241 A | 7/1991 |
| JP | 3-273026 | 12/1991 |
| JP | 4-188792 A | 7/1992 |
| JP | 05163356 A * | 6/1993 |
| JP | 8-143661 A | 6/1996 |
| JP | 2001-81282 A | 3/2001 |
| JP | 2001-219491 | 8/2001 |
| JP | 2005-97428 A | 4/2005 |
| JP | 2006-310574 A | 11/2006 |
| WO | 2002/00791 | 1/2002 |
| WO | 02/34850 A1 | 5/2002 |
| WO | 2004/048436 | 6/2004 |
| WO | 20071010932 A1 | 1/2007 |
| WO | 20071052523 A1 | 5/2007 |

OTHER PUBLICATIONS

Machine Translation of JP 05-163356 (2011).*
Machine Translation of JP 2001-219491 (2011).*
The International Search Report dated Dec. 12, 2006.
International Search Report dated Jun. 6, 2006 in co-pending foreign application No. PCT/JP2006/308958.
Singapore Communication dated Mar. 30, 2009 in co-pending foreign application No. SG 200717198-6.

(Continued)

Primary Examiner — Vasu Jagannathan
Assistant Examiner — Mark Kaucher
(74) Attorney, Agent, or Firm — Neilds, Lemack & Frame, LLC

(57) ABSTRACT

The present invention relates to a phenolic hydroxy group-containing rubber-modified polyamide resin which has, in the molecule, a phenolic hydroxy group-containing aromatic polyamide segment having a structure represented by the following formula (A)

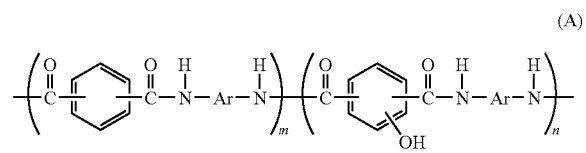

(A)

(wherein, m and n are average values and Ar represents a divalent aromatic group)
and a butadiene (co)polymer segment selected from the following formula (B-1) or (B-2), $$-(CH_2-CH=CH-CH_2)_x- \quad (B-1)$$

$$-(CH_2-CH=CH-CH_2)_Y-(CH_2-CH(CN))_Z- \quad (B-2)$$

(wherein, each of x, y and z is an average value and $0.01 \leq z/(y+z) \leq 0.13$, x represents a positive number of 5 to 200, and also y+z is a positive number of 10 to 200), and a resin composition containing said resin, in particular an epoxy resin composition; a cured product of said epoxy resin composition is excellent in flexibility, heat resistance and electrical properties especially at high temperature and high humidity.

8 Claims, No Drawings

OTHER PUBLICATIONS

Chinese Communication (with English translation) dated Mar. 27, 2009 in co-pending foreign application CN 2006800146524.
European Communication dated Jun. 23, 2009 in co-pending foreign application Nos. EP 06732461.6 and PCT/JP2006308958.
International Search Report dated Sep. 12, 2006 in co-pending foreign application No. PCT/JP2006/314254.
Chinese Communication (with English translation) dated Sep. 11, 2009 in co-pending foreign application No. CN 200680014652.4.
Office Action dated Oct. 5, 2009 in co-pending U.S. Appl. No. 11/918,975.
Final Rejection dated May 26, 2010 in co-pending U.S. Appl. No. 11/918,975.
Office Action dated Nov. 10, 2010 in co-pending U.S. Appl. No. 11/988,593.
Chinese Communication dated Feb. 17, 2011 in co-pending foreign application No. CN 200680014652.4.
International Search Report dated Aug. 19, 2008 in co-pending foreign application No. PCT/JP2008/058767.
JIS—Japanese Industrial Standard JIS C 6515: 1998 (IEC 61249-5-1: 1995); "Copper foil for printed wiring boards", 21 pages.
Office Action dated Nov. 12, 2010 in co-pending U.S. Appl. No. 12/451,359.
Final Rejection dated Jul. 20, 2011 in co-pending U.S. Appl. No. 12/451,359.
Final Rejection dated Jun. 22, 2011 in co-pending U.S. Appl. No. 11/988,593.
Chinese Communication, with English Translation, dated Aug. 15, 2011 in co-pending Chinese Patent Application No. CN 200680014652.4, 7 pages.
Office Action dated Oct. 3, 2011 in co-pending U.S. Appl. No. 11/918,975.

* cited by examiner

RUBBER-MODIFIED POLYAMIDE RESIN, EPOXY RESIN COMPOSITION AND CURED PRODUCT THEREOF

TECHNICAL FIELD

The present invention relates to a phenolic hydroxy group-containing rubber-modified polyamide resin and an epoxy resin composition whose essential components are said resin and an epoxy resin, as well as a material for flexible printed wiring boards and a semiconductor insulating film using these.

BACKGROUND ART

Polyamide resins have been developed typically as additives and curing agents which modify properties of epoxy resin and the like, and epoxy compositions containing it as a component become generally cured products excellent in heat resistance, mechanical properties, chemical resistance and the like, and are utilized in the wide range of fields of adhesive, coating, laminated sheet, molding material, casting material and the like. Conventionally, the epoxy resin having been used most commonly as a main component of such epoxy resin compositions includes bisphenol A type epoxy resin. Further, acid anhydrides and amine compounds are known as curing agents for epoxy resin, while a phenolic novolak excellent in electric reliability is often used in the fields of electrical and electronic parts in view of heat resistance and the like. In addition, a nitrile rubber-based additive is used for the purpose of imparting flexibility to cured products, and above all, a nitrile rubber-modified polyamide is known as a heat resistant and flexibility additive.

However, cured products of a composition containing a nitrile rubber-based additive have excellent flexibility, while they result in decreasing water fastness and electric reliability. In addition, cured products of an epoxy resin where a phenolic novolak is used as a curing agent have excellent reliability, while the cured products are rigid and lack flexibility. For forms of recent electrical and electronic parts, not only conventional large packages and plates using a rigid board where the substrate is a glass fiber but also polyimide films, PET (polyethylene terephthalate) films or moldings of a flexible sheet resin substrate have been developed, and these are utilized for flexible printed wiring boards as a laminated structure contacting a metal foil or a metallic circuit. Said laminated body is produced typically by coating an epoxy resin composition in the state of varnish onto a substrate of polyimide, copper foil or the like, removing the solvent and then curing the coated epoxy resin composition. Sufficient flexibility and high adhesiveness to a substrate of polyimide, copper foil or the like, as well as heat resistance and electric reliability are being required for the resins (resin compositions and cured products) used in this case.

It is known that when a phenolic hydroxy group-containing rubber-modified polyamide resin is added in a composition as a flexibility additive for the purpose of improving fragility of conventional epoxy resin compositions, the cured products have such properties as heat resistance and toughness (Patent Literature 1 and Patent Literature 2). In addition, Patent Literatures 3 and 4 describe that epoxy resin compositions comprising an epoxy resin and a phenolic hydroxy group-containing polyamide resin have excellent fire retardance and are also useful as materials for flexible printed wiring boards.

However, as regards the phenolic hydroxy group-containing polyamide resin disclosed in these literatures, the condensation of a diamine component and a dicarboxylic acid component is carried out in the presence of a phosphorus acid compound and a phosphorus ion and water are apt to remain due to the nature of the resin described in said Patent Literatures, resulting in that the residual amount of phosphorus ion and the remaining amount of water are high even after washing the resin. In addition, in the case of said high molecular weight polyamide resin, it is more difficult to wash and dry it sufficiently due to its increased viscosity as the molecular weight is higher, resulting in that a phosphorus ion and water are further apt to remain. Such remaining water and phosphorus ion cause deterioration of electrical properties when said resin is used for electrical and electronic parts.

[Patent Literature 1] JP H02-245032
[Patent Literature 2] JP H3-47836
[Patent Literature 3] WO 2004/048436
[Patent Literature 4] WO 2002/00791

DISCLOSURE OF THE INVENTION

Problems to be Solved by the Invention

An object of the present invention is to provide a phenolic hydroxy group-containing rubber-modified polyamide resin which can impart excellent heat resistance and high flexibility as well as high electric reliability to a cured product from an epoxy resin composition comprising said polyamide resin.

Means of Solving the Problems

The present inventors have found that when the ratio of the nitrile group in the above phenolic hydroxy group-containing rubber-modified polyamide resin is reduced, the concentration of water and impurity ion can be decreased, resulting in that electric reliability is dramatically improved, and further, flexibility and heat resistance of the cured product dose not deteriorate, and completed the present invention.

That is, the present invention relates to;
(1) A phenolic hydroxy group-containing rubber-modified polyamide resin which has, in the molecule, a phenolic hydroxy group-containing aromatic polyamide segment having a structure represented by the following formula (A) (wherein, m and n are average values and represent $0.01 \leq n/(m+n) \leq 0.30$, m+n represents a positive number of 5 to 200, and Ar represents a divalent

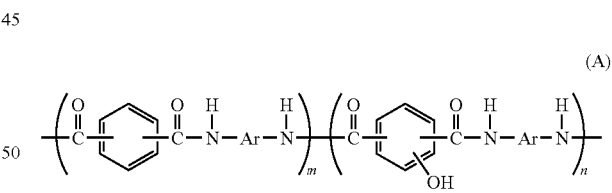

aromatic group)
and a butadiene polymer or acrylonitrile-butadiene copolymer segment selected from the following formula (B-1) or (B-2)

(wherein, each of x, y and z is an average value, x represents a positive number of 5 to 200, y and z represent $0 < z/(y+z) \leq 0.13$, and also y+z is a positive number of 10 to 200),
(2) The phenolic hydroxy group-containing rubber-modified polyamide resin according to the above (1), wherein Ar is a group represented by the following formula (1)

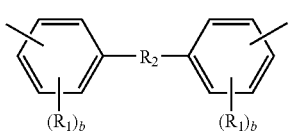

(1)

(wherein, $R_1$ is a hydrogen atom, a fluorine atom, a hydroxy group or a substituent having 1 to 6 carbon atoms which may contain O, S, P, F and Si, $R_2$ represents a direct bond or a divalent linking group composed of 0 to 6 carbon atoms which may contain O, N, S, P, F and Si, and b is an average substituent number and represents a positive number of 0 to 4), (3) A phenolic hydroxy group-containing rubber-modified polyamide resin obtained by reaction of (a) one or both kinds selected from the group consisting of a butadiene polymer which is terminated with a carboxy group at both ends and has a weight average molecular weight of 1,000 to 10,000 and an acrylonitrile-butadiene copolymer which is terminated with a carboxy group at both ends and has a weight average molecular weight of 1,000 to 10,000 with and (b) a polyamide resin terminated with an amino group at both ends, having a structure represented by the above formula (A), wherein the molar ratio of the repeating unit represented by the following formula (B-3)

—(CH$_2$—CH=CH—CH$_2$)—                    (B-3)

and the repeating unit represented by the following formula (B-4)

—(CH$_2$—CH(CN))—                          (B-4)

is $0 \leq (B\text{-}4)/((B\text{-}3)+(B\text{-}4)) \leq 0.13$, (4) A phenolic hydroxy group-containing rubber-modified polyamide resin obtained by reaction of (a) one or both kinds selected from the group consisting of a butadiene polymer which is terminated with an amino group at both ends and has an average repeating number of 1,000 to 10,000 and an acrylonitrile-butadiene copolymer which is terminated with an amino group at both ends and has an average repeating number of 1,000 to 10,000 with (b) a polyamide resin terminated with a carboxy group at both ends, having a structure represented by the above formula (A), wherein the molar ratio of the repeating unit represented by the following formula (B-3)

—(CH$_2$—CH=CH—CH$_2$)—                    (B-3)

and the repeating unit represented by the following formula (B-4)

—(CH$_2$—CH(CN))—                          (B-4)

is $0 \leq (B\text{-}4)/((B\text{-}3)+(B\text{-}4)) \leq 0.13$, (5) The phenolic hydroxy group-containing rubber-modified polyamide resin according to any one of the above (1) to (4), wherein the phosphorus ion concentration is not more than 100 ppm, (6) A resin composition characterized by containing the phenolic hydroxy group-containing rubber-modified polyamide resin according to any one of the above (1) to (5) and an organic solvent, (7) An epoxy resin composition characterized by containing the phenolic hydroxy group-containing rubber-modified polyamide resin according to any one of the above (1) to (5) and an epoxy resin, (8) A film wherein the epoxy resin composition according to the above (7) is processed into a sheet, (9) A cured product of the epoxy resin composition according to the above (7) or the film according to the above (8),

(10) An adhesive sheet for flexible printed wiring boards, which is composed of a sheet having a layer of the epoxy resin composition according to the above (7) or the film according to the above (8),

(11) A reinforcing plate for flexible printed wiring boards, which has a layer of the epoxy resin composition according to the above (7) or the film according to the above (8) or the cured product according to the above (9),

(12) A cover lay for flexible printed wiring boards, which has a layer of the epoxy resin composition according to the above (7) or the film according to the above (8) or the cured product according to the above (9),

(13) A one- or both-sided metal-clad resin laminated sheet characterized by that one side of the metal foil layer or the resin side of the one-sided metal-clad resin laminated sheet adheres to contact with one or both sides of a layer of the epoxy resin composition according to the above (7) or the film according to the above (8) or the cured product according to the above (9),

(14) A flexible printed wiring board characterized by using the epoxy resin composition according to the above (7) or the film according to the above (8) or having a layer of the cured product according to the above (9),

(15) A semiconductor insulating film having a layer of the epoxy resin composition according to the above (7) or the film according to the above (8) or the cured product according to the above (9),

(16) The phenolic hydroxy group-containing rubber-modified polyamide resin according to claim 1, which has, in the molecule, a butadiene polymer segment represented by the formula (B-1),

(17) The phenolic hydroxy group-containing rubber-modified polyamide resin according to claim 1, which contains, in the molecule, an acrylonitrile-butadiene copolymer segment represented by the formula (B-2) wherein y and z have the relation of $0<z/(y+z)<0.09$.

Effect of the Invention

The phenolic hydroxy group-containing rubber-modified polyamide resin of the present invention or a resin composition containing this (for example, a solvent-containing resin composition or an epoxy resin composition) has enough flexibility even when formed into a thin film, and excellent electric reliability such as electric insulation property. Further, a film or a thin layer where said epoxy resin composition processed into a sheet and a cured product thereof have excellent heat resistance and adhesiveness in addition to the above flexibility and electric reliability, so they can be employed widely in production of flexible printed wiring substrates, semiconductor devices and the like and are extremely useful in the field of electric material such as electric substrate and insulating film.

BEST MODE FOR CARRYING OUT THE INVENTION

The phenolic hydroxy group-containing rubber-modified polyamide resin of the present invention (hereinafter, also referred to as the present resin) has no particular limit as long as it is a phenolic hydroxy group-containing rubber-modified polyamide resin which has, in the molecule, a phenolic hydroxy group-containing aromatic polyamide segment having a structure represented by the following formula (A)

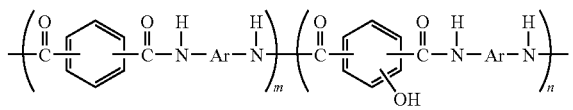

(wherein, m and n are average values and represent $0.01 \leq n/(m+n) \leq 0.30$, m+n is a positive number of 5 to 200, and Ar represents a divalent aromatic group)
and a butadiene polymer or acrylonitrile-butadiene copolymer segment selected from the following formula (B-1) or the formula (B-2)

(wherein, each of x, y and z is an average value, x represents a positive number of 5 to 200, y and z represent $0<z/(y+z) \leq 0.13$, preferably $0<z/(y+z) \leq 0.10$, and further preferably $0<z/(y+z)<0.09$, and y+z is a positive number of 10 to 200).

The —Ar— group in the formula (A) preferably has one or more kinds among aromatic residue groups represented by the following formula (3)

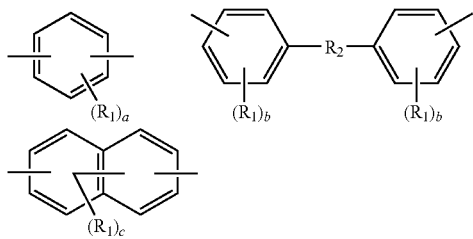

(wherein, $R_1$ represents a substituent on the benzene ring or the naphthalene ring and is a substituent having 1 to 6 carbon atoms which may contain a hydrogen atom, a fluorine atom, a hydroxy group or O, S, P, F or/and Si; $R_2$ represents a direct bond or a divalent linking group composed of 0 to 6 carbon atoms which may contain O, N, S, P, F or Si (provided that any divalent atom of O, N, S, P, F or Si when the number of carbon atoms is zero); and a, b and c are respectively their average numbers of substituent, each of a and b represents a positive number of 0 to 4, and c represents a positive number of 0 to 6), and among them an aromatic residue group represented by the following formula (1)

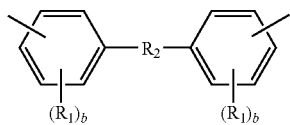

(wherein, $R_1$, $R_2$ and b represent the same meaning as in the formula (3)) is preferable.

In the formula (1), preferable $R_1$ includes a hydrogen atom, a hydroxy group, a chain alkyl group such as a methyl group, an ethyl group, a propyl group, a butyl group, a pentyl group or a hexyl group, a cyclic alkyl group such as a cyclobutyl group, a cyclopentyl group or a cyclohexyl group, and the like. They can be the same or different from each other, however, preferably they all are the same and more preferably hydrogen atoms. Further, in the formula (1), preferable $R_2$ includes a direct bond, —O—, —SO$_2$—, —CO—, —(CH$_2$)$_{1-6}$—, —C(CH$_3$)$_2$—, —C(CF$_3$)$_2$— and the like, and more preferably —O—. In addition, in the formula (1), such a structure that —NH— group bonds preferably to a 3,4'- or 4,4'- and more preferably 3,4'-, is preferably selected.

For synthesis of the phenolic hydroxy group-containing rubber-modified polyamide of the present invention, for example, the method described in JP H3-47836 and the like can be applied. Specifically, a polyamide component obtained by condensation of an aromatic diamine material (hereinafter, optionally, also referred to as a diamine component) and an aromatic dicarboxylic acid material and/or a phenolic hydroxy group-containing aromatic dicarboxylic acid material (hereinafter, also referred to as the present dicarboxylic acid material or optionally the present dicarboxylic acid for simplicity) and a butadiene polymer or acrylonitrile-butadiene copolymer component (hereinafter, also referred to as the present butadiene polymer component for simplicity) are reacted to obtain the phenolic hydroxy group-containing rubber-modified polyamide. The reaction of the above polyamide component and the present butadiene polymer component is a condensation reaction of a phenolic hydroxy group-containing aromatic polyamide terminated with amine at both ends obtained by excess of an aromatic diamine material and the present butadiene polymer component terminated with carboxylic acid at both ends or a phenolic hydroxy group-containing aromatic polyamide terminated with carboxylic acid at both ends obtained by excess of an aromatic dicarboxylic acid material and the present butadiene polymer component terminated with amine at both ends.

The condensation of the above aromatic diamine material and the present dicarboxylic acid material and the condensation of the above polyamide component and the present butadiene polymer component terminated with carboxylic acid or amine at both ends can be carried out in the presence of a pyridine derivative (including pyridine) and a phosphorus condensation agent. In said reaction, if needed, organic solvents other than a pyridine derivative can be employed. In addition, in said reaction, an inorganic salt such as lithium chloride or calcium chloride is added and the reaction carried out in the presence of them, resulting in that the molecular weight of the condensate is increased. The phosphorus condensation agent is preferably a phosphate ester. By this production method, said phenolic hydroxy group dose not to react with other reaction groups, for example, a carboxy group or an amino group without protecting the phenolic hydroxy group as a functional group, resulting in that the above rubber-modified polyamide resin can be produced easily. In addition, high temperature is not necessary in polycondensation. This production method has an advantage that polycondensation at about 150° C. or less is possible, so the double bond in the rubber component is retained as it is.

Aromatic diamine as the material includes phenylenediamine derivatives such as m-phenylenediamine, p-phenylenediamine and m-tolylenediamine; diaminodiphenyl ether derivatives such as 4,4'-diaminodiphenyl ether, 3,3'-dimethyl-4,4'-diaminodiphenyl ether and 3,4'-diaminodiphenyl ether; diaminodiphenyl thioether derivatives such as 4,4'-diaminodiphenyl thioether, 3,3'-dimethyl-4,4'- diaminodiphenyl thioether, 3,3'-diethoxy-4,4'-diaminodiphenyl thioether, 3,3'-diaminodiphenyl thioether and 3,3'-dimethoxy-4,4'-diaminodiphenyl thioether; diaminobenzophenone derivatives such as 4,4'-diaminobenzophenone and 3,3'-dimethyl-4,4'-diaminobenzophenone; diaminodiphenyl sulfone derivatives such as 4,4'-diaminodiphenyl sulfoxide and 4,4'-diaminodiphenyl sulfone; diaminobiphenyl derivatives such as benzidine, 3,3'-dimethylbenzidine, 3,3'-dimethoxybenzidine and 3,3'-diaminobiphenyl; xylylenediamine derivatives such as p-xylylenediamine, m-xylylenediamine and o-xylylenediamine; diaminodiphenylmethane derivatives such as 4,4'-diaminodiphenylmethane, 3,3'-diaminodiphenylmethane, 4,4'-diamino-3,3'-dimethyldiphenylmethane, 4,4'-diamino-3,3'-diethyldiphenylmethane, 4,4'-diamino-3,3',5,5'-tetramethyldiphenylmethane and 4,4'-diamino-3,3',5,5'-tetraethyldiphenylmethane; and the like; preferably phenylenediamine derivatives, diaminodiphenylmethane derivatives or diaminodiphenyl ether derivatives, further preferably diaminodiphenylmethane derivatives (a compound where $R_2$ in the formula (1) has a structure of $—CH_2—$) or diaminodiphenyl ether derivatives (a compound where $R_2$ in the formula (1) has a structure of $—O—$), and particularly preferably diaminodiphenyl ethers, specifically 3,4'-diaminodiphenyl ether or 4,4'-diaminodiphenyl ether in terms of solubility in solvent and heat resistance of the polymer to be obtained.

In the present dicarboxylic acid materials, the above phenolic hydroxy group-containing aromatic dicarboxylic acid has no particular limit as long as it has a structure where an aromatic ring, preferably a benzene ring or a naphthalene ring, has two carboxylic acids and one or more hydroxy groups, and more preferably, for example, dicarboxylic acid having a hydroxy group and two carboxylic acids on the benzene ring, such as 5-hydroxyisophthalic acid, 4-hydroxyisophthalic acid, 2-hydroxyisophthalic acid, 3-hydroxyisophthalic acid and 2-hydroxyterephthalic acid. Among these phenolic hydroxy group-containing aromatic dicarboxylic acids, 5-hydroxyisophthalic acid is preferable in terms of solubility in solvent and purity of the polymer to be obtained, and electrical properties, adhesiveness to metal foil and polyimide and the like, of the epoxy resin composition. The phenolic hydroxy group-containing aromatic dicarboxylic acid is used at the ratio of not less than 1 mol % and not more than 30 mol % in the whole aromatic dicarboxylic acid materials. This ratio determines n/(n+m) in the formula (A).

In addition, in the present dicarboxylic acid materials, the above aromatic dicarboxylic acid has no particular limit as long as the aromatic ring, preferably a benzene ring or a naphthalene ring, has two carboxylic acids, however an aromatic dicarboxylic acid having two carboxylic acids on the benzene ring is more preferable, including, for example, phthalic acid, isophthalic acid, terephthalic acid and the like, isophthalic acid being the most preferable.

The above phosphite ester as a condensation agent can include triphenyl phosphite, diphenyl phosphite, tri-o-tolyl phosphite, di-o-tolyl phosphite, tri-m-tolyl phosphite, tri-p-tolyl phosphite, di-p-tolyl phosphite, di-p-chlorophenyl phosphite, tri-p-chlorophenyl phosphite, di-p-chlorophenyl phosphite and the like, but is not limited thereto.

In addition, the pyridine derivatives to be used together with phosphite ester can be exemplified by pyridine, 2-picoline, 3-picoline, 4-picoline, 2,4-lutidine and the like. Typically, pyridine is preferable.

The polymers to be used as the above present butadiene polymer component (a rubber component terminated with carboxylic acid or amine at both ends) include a butadiene polymer having the structure represented by the above formula (B-1), an acrylonitrile-butadiene copolymer represented by the formula (B-2) and other acrylonitrile-butadiene copolymers. In the present invention, the nitrile group contained in the resin is an important element and an excessive amount thereof causes electric characteristics of the resin to deteriorate. Therefore, when an acrylonitrile-butadiene copolymer is used alone, the ratio of the segment containing the nitrile group is needed to satisfy the above relation of y and z, i.e., $0<z/(y+z)\leqq0.13$, more preferably $0<z/(y+z)\leqq0.10$, or optionally $0<z/(y+z)<0.09$.

In addition, the present resin can be obtained, as described above, by condensation of the above polyamide component with a butadiene polymer having the structure of the formula (B-1) alone or an acrylonitrile-butadiene copolymer having the structure of the formula (B-2) alone as the present butadiene polymer component, otherwise by condensation of the above polyamide component with both said butadiene polymer and said acrylonitrile-butadiene copolymer in combination. When the present resin is synthesized using both said butadiene polymer and said acrylonitrile-butadiene copolymer in combination, the acrylonitrile-butadiene copolymer to be used is not needed to satisfy the relation of y and z of the above formula (B-2), however it is necessary to adjust the combination ratio of the both so that the molar ratio of the butadiene segment represented by the following formula (B-3)

$$—(CH_2—CH=CH—CH_2)—\qquad(B\text{-}3)$$ 

and the acrylonitrile segment represented by the following formula (B-4)

$$—(CH_2—CH(CN))—\qquad(B\text{-}4)$$ 

in the present resin obtained by the combination is $0\leqq(B\text{-}4)/((B\text{-}3)+(B\text{-}4))\leqq0.13$, preferably $0\leqq(B\text{-}4)/((B\text{-}3)+(B\text{-}4))\leqq0.10$, and optionally $0\leqq(B\text{-}4)/((B\text{-}3)+(B\text{-}4))<0.09$.

In this connection, the above molar ratio is zero when said butadiene polymer is used alone.

When used in combination as above, an acrylonitrile-butadiene copolymer having a weight average molecular weight of 1,000 to 10,000 and a butadiene polymer having a weight average molecular weight of 1,000 to 10,000 are preferably used, the both being more preferably about 2,500 to 6,000. The molecule weights of an acrylonitrile polymer and a butadiene polymer to be used in combination may be different from each other, however, more preferably at the same level.

The present butadiene polymer component is generally available as Hycar CTB or ATB (trade names of butadiene polymers) or Hycar CTBN or ATBN (trade names of acrylonitrile-butadiene copolymers) from Ube Industries, Ltd.

The most preferable condensation agents in production of the present resin (the phenolic hydroxy group-containing rubber-modified polyamide resin) are the above phosphite ester and pyridine derivatives. A pyridine derivative is typically used by adding to an organic solvent. Said organic solvent is desired not to substantially react with phosphite ester and also to have a property to well dissolve the above aromatic diamine material and the above present dicarboxylic acid material, as well as to be a good solvent for the phenolic hydroxy group-containing rubber-modified polyamide resin which is a reaction product. Such an organic solvent includes an amide solvent such as N-methylpyrrolidone or dimethylacetoamide, as well as toluene, methylethylketone or a mixed solvent thereof with an amide solvent, and above all N-methyl-2-pyrrolidone is preferable. Typically, among mixtures of a pyridine derivative and a solvent, a mixture where a pyridine derivative is added at a ratio accounting for 5 to 30% by weight is used.

In addition, in order to obtain a phenolic hydroxy group-containing rubber-modified polyamide resin having a high degree of polymerization, an inorganic salt such as lithium chloride or calcium chloride is preferably added in addition to the above phosphate ester, pyridine derivative and organic solvent.

Hereinafter, the production method of the phenolic hydroxy group-containing rubber-modified polyamide resin of the present invention will be more specifically described. Firstly, a phosphite ester is added to a mixed solvent composed of an organic solvent containing a pyridine derivative, and the present dicarboxylic acid and a diamine component of 0.5 to 2 mol based on 1 mol of said dicarboxylic acid are added thereto, followed by heating and stirring under an inert atmosphere of nitrogen or the like to obtain a phenolic hydroxy group-containing aromatic polyamide terminated with carboxylic acid or amine at both ends. This reaction is carried out typically for 1 to 20 hours at a reaction temperature of 50 to 100° C. After the reaction, the present butadiene polymer component terminated with carboxylic acid or amine at both ends is added further to the reaction system, followed by heating and stirring under an inert atmosphere to react the both. In this connection, a butadiene polymer component terminated with carboxylic acid at both ends is used as the present butadiene polymer component when said polyamide is terminated with amine at the both ends, and a butadiene polymer component terminated with amine at the both ends is used as the present butadiene polymer component when said polyamide is terminated with carboxylic acid at the both ends. Typically, the former is preferable. Based on said polyamide, the addition amount of the said present butadiene polymer component is preferably carboxylic acid/amine=0.8 to 1.2 (equivalent ratio). In addition, said present butadiene polymer component is suitably diluted with an inert solvent such as pyridine and added dropwise. The reaction of said polyamide and said present butadiene polymer component is carried out typically for 1 to 20 hours at a reaction temperature of 50 to 100° C. After the reaction is completed, a poor solvent such as water, methanol or hexane is added to the reaction solution or the reaction solution is charged into a poor solvent, to separate the polymer, which is then purified by a reprecipitation method to remove by-products, inorganic salts and the like, in order to obtain the phenolic hydroxy group-containing rubber-modified polyamide resin of the present invention (the present resin).

The present resin as such obtained has low amounts of phosphorus ion and water contained in the resin, is improved on its electrical properties such as electric permittivity, and preferably used for application of electronic and electric parts. The phosphorus ion concentration in the present resin is typically not more than 100 ppm, preferably not more than 50 ppm, and more preferably not more than 30 ppm. The lower limit is preferable to be lower, however it is not less than 1 ppm in view of economic efficiency and typically not less than 5 ppm. Phosphorus ion here means an ion containing a phosphorus atom and is a generic term for phosphoric ion, phosphorous ion and the like. In addition, the water content in the present resin is not more than 2.0%, more preferably not more than 1.5%, and further preferably not more than 1.0%. The lower limit is preferable to be lower, however it is not less 0.1% in view of economic efficiency and typically about not less than 0.5%.

Typically, the addition amount of phosphite ester as a condensation agent in the above production method is preferably equimolar or more based on the carboxy group in the reaction materials. Typically, it is preferably not more than 30 times by mol and not efficient at not less than 30 times by mol. In addition, it may be about 80 mol % based on the above carboxy group in such cases that phosphite triester is used, and phosphite diester as by-product is also a condensation agent, and the like. The amount of pyridine derivative is required to be equimolar or more based on the above carboxy group. In practical, the pyridine derivative is often used in a large-excessive amount because it also serves as a reaction solvent. The amount of a mixture to be used which is composed of the above pyridine derivative and organic solvent is preferably in the range of same amount to 10 times amount (ratio by weight) based on the phenolic hydroxy group-containing rubber-modified polyamide resin obtained in theory. Typically, the reaction temperature is preferably 60 to 180° C. The reaction time is largely influenced by the reaction temperature, however typically a few minutes to 20 hours because the reaction system is preferably stirred until the highest viscosity representing the highest polymerization degree is obtained in any case. Under the above preferable reaction conditions, a phenolic hydroxy group-containing aromatic polyamide, preferably a phenolic hydroxy group-containing aromatic polyamide terminated with amine at both ends is obtained by condensation reaction of 5-hydroxyisophthalic acid and isophthalic acid with 3,4'-diaminodiphenyl ether and then said polyamide obtained is reacted with the present butadiene polymer component, preferably the present butadiene polymer component terminated with a carboxy group at both ends, such that being carboxylic acid/amine=0.8 to 1.2 (molar ratio), to obtain the most preferable phenolic hydroxy group-containing rubber-modified polyamide resin having a weight average molecular weight of about 10,000 to 1,000,000, preferably 60,000 to 500,000, and further preferably 100,000 to 250,000.

The intrinsic viscosity value (measured with an N,N-dimethylacetamide solution of 0.5 dl/g at 30° C.) of the above phenolic hydroxy group-containing rubber-modified polyamide resin having a preferable polymerization degree is in the range of 0.1 to 4.0 dl/g. The judgment about whether or not to have a preferable average polymerization degree is generally made by reference to the intrinsic viscosity. The intrinsic viscosity less than 0.1 dl/g is not preferable because the film-formation property and expression of property of the polyamide resin is insufficient. By contraries, the intrinsic viscosity more than 4.0 dl/g causes such problems that the polymerization degree is so high that the solubility in solvent decreases, and the fabrication property deteriorates. The more preferable intrinsic viscosity value of said rubber-modified polyamide resin is about 0.2 to 2.0 dl/g, and further preferable is about 0.3 to 0.6 dl/g.

A simple method to adjust the polymerization degree of the phenolic hydroxy group-containing rubber-modified polyamide resin can include a method to adjust the ratio of carboxylic acid/amine. Use in large-excessive amount of any one of the components causes lowering of the polymerization degree. In addition, the ratio of the nitrile group in the rubber component is determined according to the ratio of the nitrile group in the acrylonitrile-butadiene copolymer component or the use ratio of the butadiene polymer and the acrylonitrile-butadiene copolymer to be used in combination, and can be observed through the peak strength at about 2250 cm$^{-1}$ on FT-IR spectra.

The resin composition of the present invention has no particular limit as long as it contains the phenolic hydroxy group-containing rubber-modified polyamide of the present invention. As one of the simplest examples, a resin solution where the present resin is dissolved in a solvent can be cited. Said resin solution can be obtained, for example, by repeating of dissolution and precipitation in the present resin purification process described above followed by further dissolving in a solvent. The solvent includes, for example, γ-butyrolactones, amide solvents such as N-methylpyrrolidone (NMP), N,N-dimethylformamide (DMF), N,N-dimethylacetamide and N,N-dimethylimidazolidinone, sulfones such as tetramethylene sulfone, ether solvents such as diethylene glycol dimethyl ether, diethylene glycol diethyl ether, propylene glycol, propylene glycol monomethyl ether, propylene glycol monomethyl ether monoacetate and propylene glycol monobutyl ether, ketone solvents such as methylethylketone, methylisobutylketone, cyclopentanone and cyclohexanone, and aromatic solvents such as toluene and xylene. The resin concentration in the obtained resin solution is typically 10 to 80% by weight, preferably 20 to 70% by weight. For example, an epoxy resin can be added to said resin solution to give an epoxy resin composition of the present invention as one of the resin compositions of the present invention.

The epoxy resin composition of the present invention has no particular limit as long as it contains the phenolic hydroxy group-containing rubber-modified polyamide of the present invention and an epoxy resin. Said epoxy resin preferably contains an aromatic ring, and more preferably has an aromatic ring such as benzene ring, biphenyl ring or naphthalene ring and two or more epoxy groups in 1 molecule. Specifically, it includes novolak-type epoxy resins, xylylene skeleton-containing phenolic novolak-type epoxy resins, biphenyl skeleton-containing novolak-type epoxy resins, bisphenol A type epoxy resins, bisphenol F type epoxy resins, tetramethylbiphenol type epoxy resins and the like, but is not limited thereto. Biphenyl skeleton-containing novolak-type epoxy resins are more preferable.

In the epoxy resin composition of the present invention, the phenolic hydroxy group-containing rubber-modified polyamide resin of the present invention (the present resin) acts as a curing agent. In said epoxy resin composition, curing agents other than said rubber-modified polyamide resin may be used in combination. Specific example of said other curing agents include diaminodiphenylmethane, diethylenetriamine, triethylenetetramine, diaminodiphenyl sulfone, isophoronediamine, dicyandiamide, polyamide resin synthesized from of a linolenic acid dimer and ethylenediamine, phthalic anhydride, trimellitic anhydride, pyromellitic acid, maleic anhydride, tetrahydrophthalic anhydride, methyltetrahydrophthalic anhydride, methyinadic anhydride, hexahydrophthalic anhydride, methylhexahydrophthalic anhydride, phenolic aralkyl resin, phenolic novolak, triphenylmethane and modified ones thereof, imidazole, BF$_3$-amine complexes, guanidine derivatives and the like, but is not limited thereto. When these are used in combination, the ratio of the present resin in all the curing agents accounts typically for 20 to 95% by weight (hereinafter, the same unless otherwise specified), preferably 30 to 90%, more preferably 40 to 80%, and optionally 50 to 70% is most preferable. Optionally, combination use is preferred, and other curing agents to be used in combination are preferably phenol resins such as phenolic aralkyl resin and phenolic novolak, and more preferably phenolic aralkyl resin.

In the epoxy resin composition of the present invention, the amount of curing agents to be used is preferably 0.7 to 1.2 equivalent of active hydrogen based on 1 equivalent of epoxy group of the epoxy resin. In any of the cases that it is less than 0.7 equivalent of active hydrogen or more than 1.2 equivalent of active hydrogen based on 1 equivalent of epoxy group, curing is insufficient and good properties of cured product may not be obtained. The active hydrogen equivalent of the phenolic hydroxy group-containing rubber-modified polyamide resin of the present invention can be calculated from the amount of the phenolic hydroxy group-containing aromatic dicarboxylic acid and the amount of the aromatic diamine component which are charged in the reaction.

The use ratio of the epoxy resin and the present resin in said epoxy resin composition could not be completely determined because it varies depending on the epoxy equivalent of the epoxy resin to be used and the hydroxy group equivalent of the present resin and the like, however it is 10 to 600 parts (by weight; hereinafter the same) based on 100 parts of the epoxy resin, preferably 50 to 500 parts, more preferably about 70 to 400 parts, and optionally it is further preferably more than 100 parts and not more than 400 parts and most preferably around 150 or 200 to 400 parts. Particularly when an epoxy resin having an epoxy equivalent of around 200 to 400 g/eq and the present resin having a hydroxy group equivalent of 2,000 to 20,000 g/eq, preferably around 3,000 to 10,000 g/eq are used, the above use ratio of the epoxy resin and the present resin can give a very desirable result.

In addition, in the case of using the above curing agents, a curing accelerator may be as well used in combination. Specific examples of said curing accelerator include, for example, imidazoles such as 2-methylimidazole, 2-ethylimidazole, 2-ethyl-4-methylimidazole, 2-phenyl-4,5-dihydroxymethylimidazole, 2-phenyl-4-methyl-5-hydroxymethylimidazole, tertiary amines such as 2-(dimethylaminomethyl)phenol and 1,8-diaza-bicyclo(5,4,0)undecene-7, phosphines such as triphenyl phosphine, metal compounds such as tin octylate, and the like. The curing accelerator is, according to need, used at 0.1 to 5.0 parts by weight based on 100 parts by weight of the epoxy resin.

The epoxy resin composition of the present invention contains an inorganic filler, if needed. Specific examples of said inorganic filler include calcium carbonate, calcium phosphate, silica, magnesium hydroxide, aluminum hydroxide, alumina, talc, glass staple fiber and the like. The inorganic filler is used in an amount accounting for 0 to 90% by weight in the epoxy resin composition of the present invention. Further, in the epoxy resin composition of the present invention, various formulation ingredients, for example, mold lubricants such as silane coupling agent, stearic acid, palmitic acid, zinc stearate and calcium stearate, surface smoothing agents, pigments and the like can be added The epoxy resin composition of the present invention is obtained by mixing the above components uniformly. The epoxy resin composition of the present invention can be a cured product thereof easily by a similar method to the conventional known method. For example, an epoxy resin and a curing agent, as well as a curing accelerator and an inorganic filler if needed, and formulation ingredients are mixed, by using an extruder, a kneader or a roll according to need, sufficiently until uniformity, to obtain the epoxy resin composition of the present invention, and then the epoxy resin composition is molded by a melt casting method, a transfer molding method, an injection molding method, a compression molding method or the like and further heated at 80 to 200° C. for 2 to 10 hours to obtain the cured product of the present invention.

A film formed by processing the epoxy resin composition of the present invention into sheet or a sheet having a layer of said composition is obtained by coating the epoxy resin composition of the present invention containing a solvent onto a plane support and drying, and can be used as it is as a sheet having a layer of said epoxy resin composition when the plane support is sheet. In other case, peeling the dried layer, it can be used as a film composed of said epoxy resin composition with the dried layer separated. According to need, a film composed of said epoxy resin composition or a layer of said epoxy resin composition can be further heated to obtain a cured product thereof. The solid content concentration (components except for a solvent; hereinafter the same) in the epoxy resin composition to be coated is typically 10 to 80%, preferably 20 to 70%, and more preferably around 30 to 50%.

In the above process of coating, by any of coating methods such as gravure coating, screen printing, metal masking and spin coating, the dried layer pf epoxy resin composition can be obtained by coating on the plane support and then by drying so that the thickness obtained after the drying is a predefined thickness, for example, 5 to 500 μm. The method to be applied is appropriately selected depending on the kind, shape and size of the substrate in the plane support and the thickness of the coating film. The substrate is a film made from polymers such as, for example, polyamide, polyamide-imide, polyallylate, polyethylene terephthalate, polybutylene terephthalate, polyetheretherketone, polyetherimide, polyetherketone, polyketone, polyethylene and polypropylene and/or copolymers thereof, or a metal foil such as copper foil, preferably a polyimide or a metal foil.

Preferable applications of the film or sheet of the present invention include an adhesive sheet for flexible printed wiring boards, a reinforcing plate for flexible printed wiring boards, a cover lay for flexible printed wiring boards, a resin layer of one- or both-sided metal-clad resin laminated sheets (hereinafter, these are altogether referred to as materials for flexible printed wiring board) and a semiconductor insulating film, and the epoxy resin composition of the present invention functions as an adhesive or a resin layer for flexible printed wiring board comprising these. In such applications, the plane support often has a function as a release film.

The epoxy resin composition of the present invention containing a solvent can also be impregnated in a substrate such as glass fiber, carbon fiber, polyester fiber, alumina fiber and paper and heat-dried to obtain a prepreg, which is then formed by hot pressing to obtain a cured product. The solvent in this case is used typically in an amount of 10 to 70% by weight, preferably 15 to 70% by weight in the mixture of the epoxy resin composition of the present invention and said solvent.

EXAMPLES

Next, the present invention will be further specifically described by Examples and Comparative Examples, but the present invention is not limited to these examples.

Example 1

A flask equipped with a thermometer, a cooling tube and a stirring apparatus was purged with nitrogen gas, and 9.6 g of 5-hydroxyisophthalic acid, 59.8 g of isophthalic acid, 87.7 g of 3,4'-diaminodiphenyl ether, 8.1 g of lithium chloride, 913 g of N-methylpyrrolidone and 101 g of pyridine were added thereto, stirred and dissolved, and then 220 g of triphenyl phosphite was added thereto and reacted at 90° C. for 4 hours to produce a polyamide body terminated with amine at both ends (n/(m+n)=0.13, m+n=16.3). In said reaction solution, a solution dissolving 117 g of a polybutadiene polymer which is terminated with a carboxy group at both ends (Hycar CTB 2000X162 manufactured by BF Goodrich, having a weight average molecular weight of 4200) in 175 g of pyridine and 175 g of N-methylpyrrolidone was added and further reacted at the same temperature for 4 hours to obtain a phenolic hydroxy group-containing rubber-modified polyamide resin of the present invention. This reaction solution was cooled to room temperature and then charged into 500 g of methanol to precipitate a resin, which was separated by filtration and further washed with 500 g of methanol. After that, in order to further purify said resin, methanol was added to said resin for methanol reflux, and subsequently said mixture was cooled to room temperature and filtered to obtain a resin, which was dried to obtain resin powder. The obtained amount was 250 g and the yield was 96.6%. In 20.0 ml of N,N-dimethylacetoamide, 0.100 g of this resin powder was dissolved and measured at 30° C. using an Ostwald viscometer, and the thus-obtained inherent viscosity was 0.40 dl/g (having a weight average molecular weight of about 110,000). The calculated value of hydroxy group equivalent to the epoxy group was 4,900 g/eq, the calculated value of active hydrogen equivalent to the epoxy group was 4,400 g/eq, and the phosphorus ion concentration was 16 ppm (the value obtained by that 4 g of the resin was dispersed into 40 g of water to elute phosphorus ion in water under the conditions of atmospheric pressure of 2, 120° C.×20 hours, thus-obtained phosphorus ion was measured by ion chromatography, and the result was converted to its concentration in the resin: hereinafter the same as above)

In addition, the water content of said resin was measured, resulting in 0.98% by weight. The measurement of the water content was carried out by Karl Fischer method.

Example 2

To 10 g of the resin powder obtained in Example 1, 4.0 g of NC-3000 (a biphenyl skeleton-containing novolak-type epoxy resin manufactured by Nippon Kayaku Co., Ltd.; having an epoxy equivalent of 265 to 285 g/eq and an average value of 277 g/eq) as an epoxy resin, 2.5 g of Xylock XLC-3L (a phenolic aralkyl resin manufactured by Mitsui Chemical, Inc.; having a hydroxy group equivalent of 173 g/eq) as a curing agent other than the above resin powder (the rubber-modified polyamide resin of the present invention), 0.1 g of 2-phenyl-4,5-dihydroxymethylimidazole (2PHZ) as a curing accelerator and 20 g of N,N-dimethylformamide as a solvent were added and mixed uniformly to obtain an epoxy resin composition of the present invention (having a solid content of about 45%). In this connection, for the use amount of the curing agent (the total of the rubber-modified polyamide resin of the present invention and Xylock XLC-3L) based on the epoxy resin in the obtained epoxy resin composition, the curing agent has an active hydrogen equivalent of 1.16 based on 1 equivalent of epoxy.

Example 3

The epoxy resin composition of Example 2 was coated on a PET film so that the thickness after drying was 10 μm, and dried at 140° C. for 3 minutes, followed by removing the PET film to obtain a sheet film of the present invention.

Example 4

Using UPISEL D (trade name; manufactured by Ube Kosan Co., Ltd.) as a commercially available polyimide copper-clad laminated sheet, a comb-shaped electrode (conductor/spacing=100 μm/100 μm) specified in IPC-SM-840 was formed for use as a circuit for evaluation, and the sheet film of the present invention made in Example 3 was laminated thereto, followed by heat-pressing at 170° C. and 5 MPa for 60 minutes to make a sample for electric reliability test. Using an ion migration accelerated test machine, continuous measurement of insulation resistance value was carried out for up to 1,000 hours while applying 50 V direct voltages between electrodes under the environment of 121° C. and 100% RH. The time until the insulation resistance value reached $10^5$ ohms or under was measured.

As the result, decrease of the insulation resistance value in the sheet film of the present invention was not observed even after an elapse of 1,000 hours.

Example 5

In the same manner as in Example 1 except that 85 g of a polybutadiene-acrylonitrile copolymer terminated with a carboxy group at both ends (Hycar CTBN 1300X31, manufactured by BF Goodrich; having a content of the acrylonitrile group of 10 mol % and a weight average molecular weight of 3,600) was used instead of 117 g of a polybutadiene copolymer terminated with a carboxy group at both ends (Hycar CTB2000X162, manufactured by BF Goodrich) in Example 1, a phenolic hydroxy group-containing rubber-modified polyamide resin of the present invention was obtained. This reaction solution was cooled to room temperature and then charged into 500 g of methanol to precipitate a resin, which was filtered and further washed with 500 g of methanol. After that, in order to further purify said resin, methanol was added to said resin for methanol reflux. Subsequently said mixture was cooled to room temperature and then the resin was separated by filtration and dried to obtain resin powder. The obtained amount was 240 g and the yield was 95.0%. Into 20.0 ml of N,N-dimethylacetoamide, 0.100 g of this resin powder was dissolved and measured at 30° C. using an Ostwald viscometer, and the thus-obtained inherent viscosity was 0.45 dl/g. The calculated value of hydroxy group equivalent to the epoxy group was 4,900 g/eq, and the phosphorus ion concentration was not more than 20 ppm.

Example 6

In the same manner as in Example 2 except that 10 g of the resin powder obtained in Example 5 was used instead of the resin powder obtained in Example 1 in Example 2, an epoxy resin composition of the present invention was obtained.

Example 7

In the same manner as in Example 3 except that the epoxy resin composition obtained in Example 6 was used instead of the epoxy resin composition obtained in Example 2 in Example 3, a sheet film of the present invention was obtained.

Example 8

In the same manner as in Example 4 except that the sheet film obtained in Example 7 was used instead of the sheet film of the present invention obtained in Example 3 in Example 4, evaluation was conducted.

As the result, decrease of the insulation resistance value in the sheet film of the present invention was not observed even after an elapse of 1,000 hours.

Comparative Example 1

By the same method as in Example 4 described in JP H3-47836 (where CTBN 1300X8 manufactured by BF Goodrich was used as a polybutadiene-acrylonitrile copolymer which is terminated with a carboxy group at both ends; the number average molecular weight of the rubber component was 3,550 and the mole ratio of the acrylonitrile component contained in the copolymer was 18 mol %), a phenolic hydroxy group-containing rubber-modified polyamide resin was obtained. The calculated value of hydroxy group equivalent of the obtained polyamide resin to the epoxy group was 7,600 g/eq, and the phosphorus ion concentration was not more than 1,000 ppm.

Comparative Example 2

In the same manner as in Example 2 except that 10 g of the resin powder obtained in Comparative Example 1 was used instead of the resin powder obtained in Example 1 in Example 2, an epoxy resin composition for comparison was obtained.

Comparative Example 3

In the same manner as in Example 3 except that the epoxy resin composition obtained in Comparative Example 2 was used instead of the epoxy resin composition obtained in Example 2 in Example 3, a sheet film for comparison was obtained.

Comparative Example 4

In the same manner as in Example 4 except that the sheet film obtained in Comparative Example 3 was used instead of the sheet film of the present invention obtained in Example 3 in Example 4, evaluation was conducted. As the result, the insulation resistance value reached $10^5$ ohms or under after an elapse of 24 hours.

Comparative Example 5

By the same method as in Synthesis Example 1 described in WO 02/00791, a reaction solution of a phenolic hydroxy group-containing rubber-modified polyamide resin was obtained. In this connection, as a polybutadiene-acrylonitrile copolymer terminated with a carboxy group at both ends, CTBN 1300X8 manufactured by BF Goodrich (where the weight average molecular weight was 3,550 and the content of the acrylonitrile component was 18 mol %) was used. This reaction solution was cooled to room temperature and then charged into 500 g of methanol to precipitate a resin, which was filtered and further washed with 500 g of methanol. After that, in order to further purify said resin, methanol was added to said resin for methanol reflux. Subsequently said mixture was cooled to room temperature and filtered to get a resin, which was dried to obtain resin powder. The calculated value of hydroxy group equivalent of the obtained polyamide resin to the epoxy group was 4,900 and the calculated value of active hydrogen equivalent was 4,100, the phosphorus ion concentration was 800 ppm, and the water content was 2.4% by weight.

Judging from the above, the phenolic hydroxy group-containing rubber-modified polyamide resin of the present invention has significantly less ionic impurity concentration and water content compared with the polyamide resin for comparison, and has excellent electrical properties at high temperature and high humidity.

The invention claimed is:
1. A phenolic hydroxy group-containing rubber-modified polyamide resin obtained by reaction of (1) one or both kinds selected from the group consisting of a butadiene polymer which is terminated with a carboxy group at both ends and has a weight average molecular weight of 1,000 to 10,000 and an acrylonitrile-butadiene copolymer which is terminated with a carboxy group at both ends and has a weight average molecular weight of 1,000 to 10,000 with (2) a polyamide resin terminated with an amino group at both ends and having a structure represented by the following formula (A),

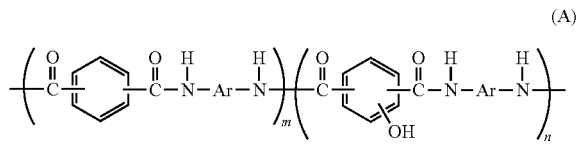

wherein, m and n are average values and represent $0.01 \leq n/(m+n) \leq 0.30$, m+n represents a positive number of 5 to 200, and Ar represents a group represented by the following formula (1)

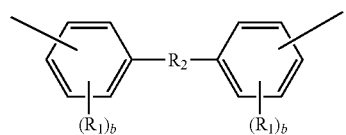

wherein, $R_1$ is a hydrogen atom, a fluorine atom, a hydroxy group or a substituent having 1 to 6 carbon atoms which may contain O, S, P, F and Si, $R_2$ represents a direct bond or a divalent linking group of 0 to 6 carbon atoms which may contain O, N, S, P, F, and Si, an b is an average substituent number and represents a positive number of 0 to 4, which has a phenolic hydroxy group-containing aromatic polyamide segment having a structure represented by the above formula (A) and a butadiene polymer or acrylonitrile-butadiene copolymer segment selected from the following formula (B-1) or (B-2)

—(CH$_2$—CH=CH—CH$_2$)$_x$— (B-1)

—(CH$_2$—CH=CH—CH$_2$)$_y$—(CH$_2$—CH(CN))$_z$— (B-2)

wherein, each of x, y and z is an average value, x represents a positive number of 5 to 200, y and z represent $0<z/(y+z)<0.09$, and also y+z is a positive number of 10 to 200, wherein the molar ratio of the repeating unit represented by the following formula (B-3)

—(CH$_2$—CH=CH—CH$_2$)— (B-3)

and the repeating unit represented by the following formula (B-4)

—(CH$_2$—CH(CN))— (B-4)

is $0 \leq (B\text{-}4)/((B\text{-}3)+(B\text{-}4))<0.09$.

2. A phenolic hydroxy group-containing rubber-modified polyamide resin obtained by reaction of (1) one or both kinds selected from the group consisting of a butadiene polymer which is terminated with an amino group at both ends and has a weight average repeating number of 1,000 to 10,000 and an acrylonitrile-butadiene copolymer which is terminated with an amino group at both ends and has an average repeating number of 1,000 to 10,000 with (2) a polyamide resin terminated with a carboxy group at both ends and having a structure represented by the following formula (A),

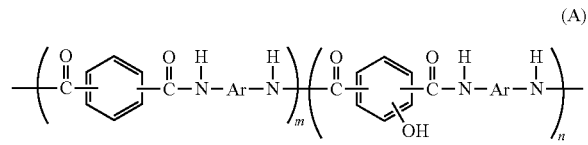

wherein, m and n are average values and represent $0.01 \leq n/(m+n) \leq 0.30$, m+n represents a positive number of 5 to 200, and Ar represents a group represented by the following formula (1)

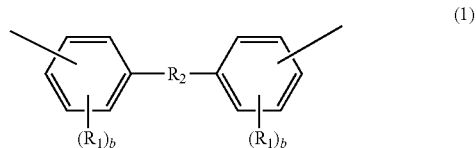

wherein, $R_1$ is a hydrogen atom, a fluorine atom, a hydroxy group or a substituent having 1 to 6 carbon atoms which may contain O, S, P, F and Si, $R_2$ represents a direct bond or a divalent linking group of 0 to 6 carbon atoms which may contain O, N, S, P, F, and Si, an b is an average substituent number and represents a positive number of 0 to 4, which has a phenolic hydroxy group-containing aromatic polyamide segment having a structure represented by the above formula (A) and a butadiene polymer or acrylonitrile-butadiene copolymer segment selected from the following formula (B-1) or (B-2)

—(CH$_2$—CH=CH—CH$_2$)$_x$— (B-1)

—(CH$_2$—CH=CH—CH$_2$)$_y$—(CH$_2$—CH(CN))$_z$— (B-2)

wherein, each of x, y and z is an average value, x represents a positive number of 5 to 200, y and z represent $0<z/(y+z)<0.09$, and also y+z is a positive number of 10 to 200, wherein the molar ratio of the repeating unit represented by the following formula (B-3)

—(CH$_2$—CH=CH—CH$_2$)— (B-3)

and the repeating unit represented by the following formula (B-4)

—(CH$_2$—CH(CN))— (B-4)

is $0 \leq (B\text{-}4)/((B\text{-}3)+(B\text{-}4))<0.09$.

3. The phenolic hydroxy group-containing rubber-modified polyamide resin according to claim 1 or 2, wherein the phosphorus ion concentration is not more than 100 ppm.

4. A resin composition characterized by containing the phenolic hydroxy group-containing rubber-modified polyamide resin according to claim 1 or 2 and an organic solvent.

5. The phenolic hydroxy group-containing rubber-modified polyamide resin according to claim 1 or 2 which has a butadiene polymer segment represented by the formula (B-1).

6. The phenolic hydroxy group-containing rubber-modified polyamide resin according to claim 1 or 2, which contains an acrylonitrile-butadiene copolymer segment represented by the formula (B-2) wherein y and z have the relation of $0<z/(y+z)<0.09$.

7. A resin composition characterized by containing the phenolic hydroxy group-containing rubber-modified polyamide resin according to claim 5 an organic solvent.

8. A resin composition characterized by containing the phenolic hydroxy group-containing rubber-modified polyamide resin according to claim 6 an organic solvent.

* * * * *